United States Patent
Yu et al.

(10) Patent No.: US 11,183,986 B2
(45) Date of Patent: Nov. 23, 2021

(54) RESONATOR ELEMENT, RESONATOR DEVICE, ELECTRONIC APPARATUS, AND VEHICLE

(71) Applicant: SEIKO EPSON CORPORATION, Tokyo (JP)

(72) Inventors: Byonhaku Yu, Minowa-Machi (JP); Shinya Aoki, Minowa-Machi (JP); Atsushi Matsuo, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 105 days.

(21) Appl. No.: 16/795,838

(22) Filed: Feb. 20, 2020

(65) Prior Publication Data
US 2020/0274518 A1  Aug. 27, 2020

(30) Foreign Application Priority Data
Feb. 21, 2019  (JP) .............. JP2019-029901

(51) Int. Cl.
| | |
|---|---|
| *H03H 9/05* | (2006.01) |
| *H03H 9/02* | (2006.01) |
| *H03H 9/19* | (2006.01) |
| *H03H 9/10* | (2006.01) |
| *H03H 9/13* | (2006.01) |

(52) U.S. Cl.
CPC ...... *H03H 9/0519* (2013.01); *H03H 9/02102* (2013.01); *H03H 9/02133* (2013.01); *H03H 9/0557* (2013.01); *H03H 9/1021* (2013.01); *H03H 9/13* (2013.01); *H03H 9/19* (2013.01)

(58) Field of Classification Search
CPC ............. H03H 9/0519; H03H 9/02102; H03H 9/02133; H03H 9/19; H03H 9/1021; H03H 9/13; H03H 9/0557; H03H 9/0547; H03H 9/02023
See application file for complete search history.

(56) References Cited

U.S. PATENT DOCUMENTS

| | | | | |
|---|---|---|---|---|
| 2009/0167117 A1* | 7/2009 | Yasuike | ................. | H03H 9/177 310/361 |
| 2014/0368089 A1* | 12/2014 | Omomo | ............... | H03H 9/0519 310/348 |
| 2016/0149555 A1* | 5/2016 | Sarata | ................... | H01L 41/053 310/348 |

FOREIGN PATENT DOCUMENTS

| | | |
|---|---|---|
| JP | H11-68503 A | 3/1999 |
| JP | 2002-100955 A | 4/2002 |
| JP | 2012-195711 A | 10/2002 |
| JP | 2003-198300 A | 7/2003 |
| JP | 2014-192712 A | 10/2014 |

* cited by examiner

*Primary Examiner* — Jeffrey M Shin
(74) *Attorney, Agent, or Firm* — Workman Nydegger (57) ABSTRACT

A resonator element includes a quartz crystal substrate including a first surface along an X axis which is an electrical axis, a second surface along the X axis, and a side surface, a first excitation electrode, a second excitation electrode, a first coupling electrode, a second coupling electrode, a first extraction electrode that couples the first excitation electrode and the first coupling electrode, and a second extraction electrode that couples the second excitation electrode and the second coupling electrode. In plan view, a virtual extension region is obtained by extending the first excitation electrode along the X axis.

11 Claims, 9 Drawing Sheets

RESONATOR ELEMENT, RESONATOR DEVICE, ELECTRONIC APPARATUS, AND VEHICLE

The present application is based on, and claims priority from JP Application Serial Number 2019-029901, filed Feb. 21, 2019, the disclosure of which is hereby incorporated by reference herein in its entirety.

BACKGROUND

1. Technical Field

The present disclosure relates to a resonator element, a resonator device, an electronic apparatus, and a vehicle.

2. Related Art

A quartz crystal resonator element disclosed in JP-A-2012-195711 includes a quartz crystal substrate and an electrode disposed at the quartz crystal substrate. The quartz crystal substrate may have a mesa shape having a thick portion and a thin portion located around the thick portion. The electrode includes a first excitation electrode disposed at an upper surface of the thick portion, a second excitation electrode disposed at a lower surface of the thick portion, a first coupling electrode and a second coupling electrode disposed at an upper surface of the thin portion, a first extraction electrode that couples the first excitation electrode and the first coupling electrode, and a second extraction electrode that couples the second excitation electrode and the second coupling electrode.

In such a configuration, since the first and second extraction electrodes are disposed in a region easily affected by the vibration characteristics of the quartz crystal resonator element, specifically, regions of the thin portion located at both sides along the X axis with respect to the thick portion, there is a possibility that the vibration characteristics of the quartz crystal resonator element may deteriorate.

SUMMARY

A resonator element according to an application example includes: a quartz crystal substrate including a first surface and a second surface that are in a front and back relationship with each other and are disposed along an X axis which is an electrical axis, and a side surface that couples the first surface and the second surface; a first excitation electrode disposed at one of the first surface and the second surface; a second excitation electrode disposed at the other of the first surface and the second surface; a first coupling electrode and a second coupling electrode disposed at the first surface; a first extraction electrode that couples the first excitation electrode and the first coupling electrode; and a second extraction electrode that couples the second excitation electrode and the second coupling electrode. In plan view of the quartz crystal substrate, when a region obtained by extending the first excitation electrode along the X axis is an extension region, the side surface has a first portion located at one side of the extension region and a second portion located at the other side, the first coupling electrode and the second coupling electrode are disposed along the first portion, the first extraction electrode has a first electrode portion which extends along the first portion and is continuous with the first coupling electrode, and the first electrode portion is disposed over the side surface, the first surface, and the second surface.

A resonator device according to another application example includes the above-described resonator element, a base, a first conductive bonding member that bonds the first coupling electrode and the base, and a second conductive bonding member that bonds the second coupling electrode and the base.

An electronic apparatus according to still another application example includes the above-described resonator device.

A vehicle according to still another application example includes the above-described resonator device.

DESCRIPTION OF EXEMPLARY EMBODIMENTS

Hereinafter, a resonator element, a resonator device, an electronic apparatus, and a vehicle of one embodiment of the present disclosure will be described in detail based on embodiments shown in the accompanying drawings.

First Embodiment

Figure 1:
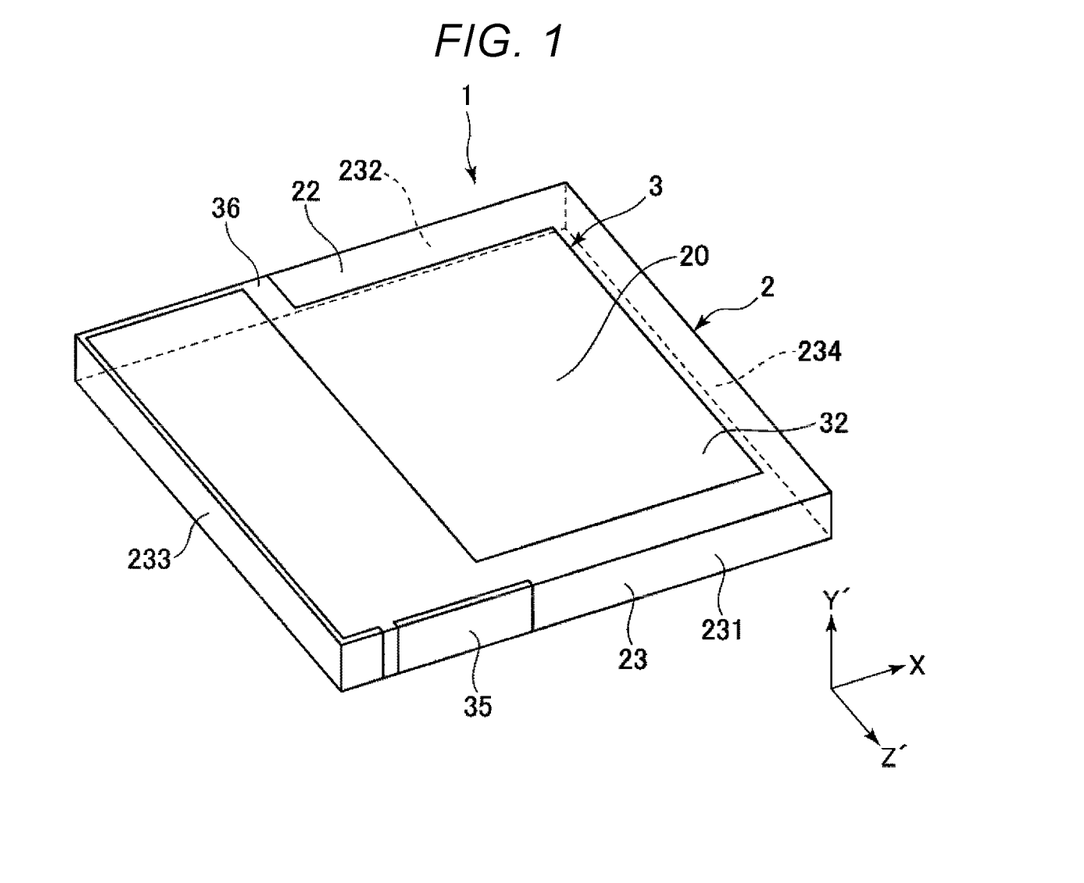
FIG. 1 is a perspective view showing a resonator element according to a first embodiment.
Figure 2:
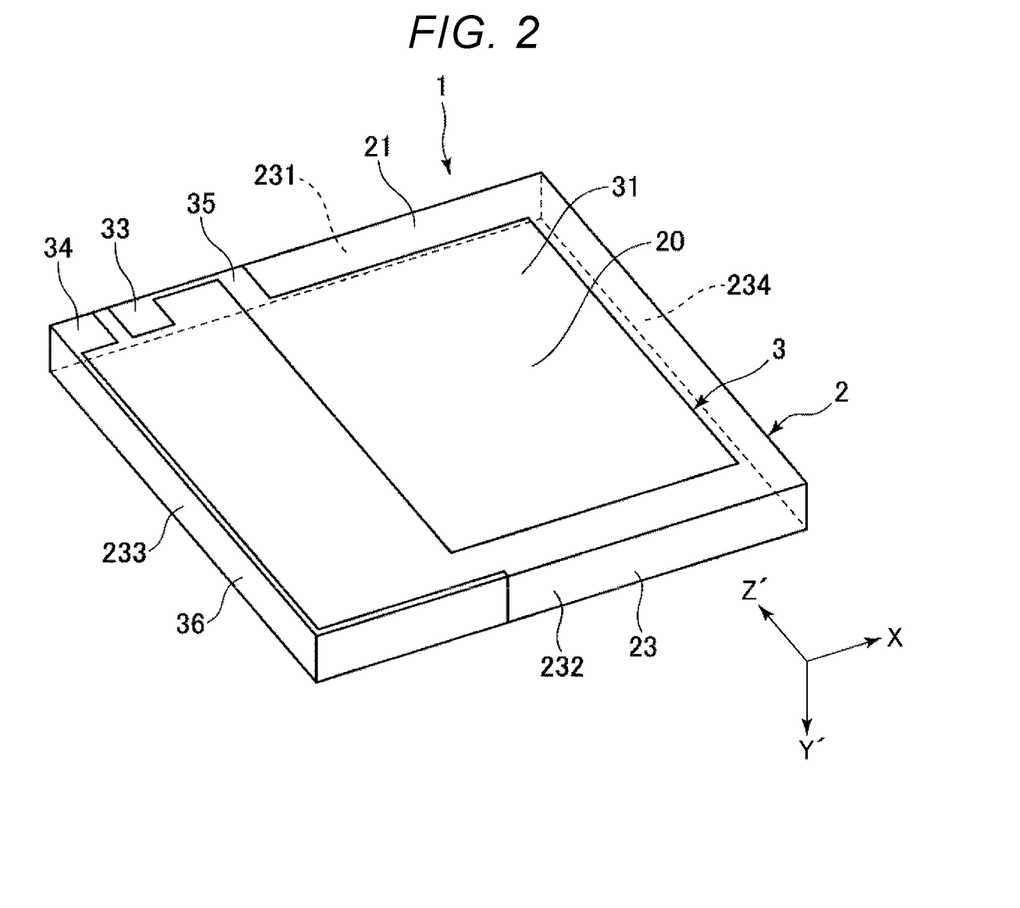
FIG. 2 is a perspective view showing the resonator element according to the first embodiment.
Figure 3:
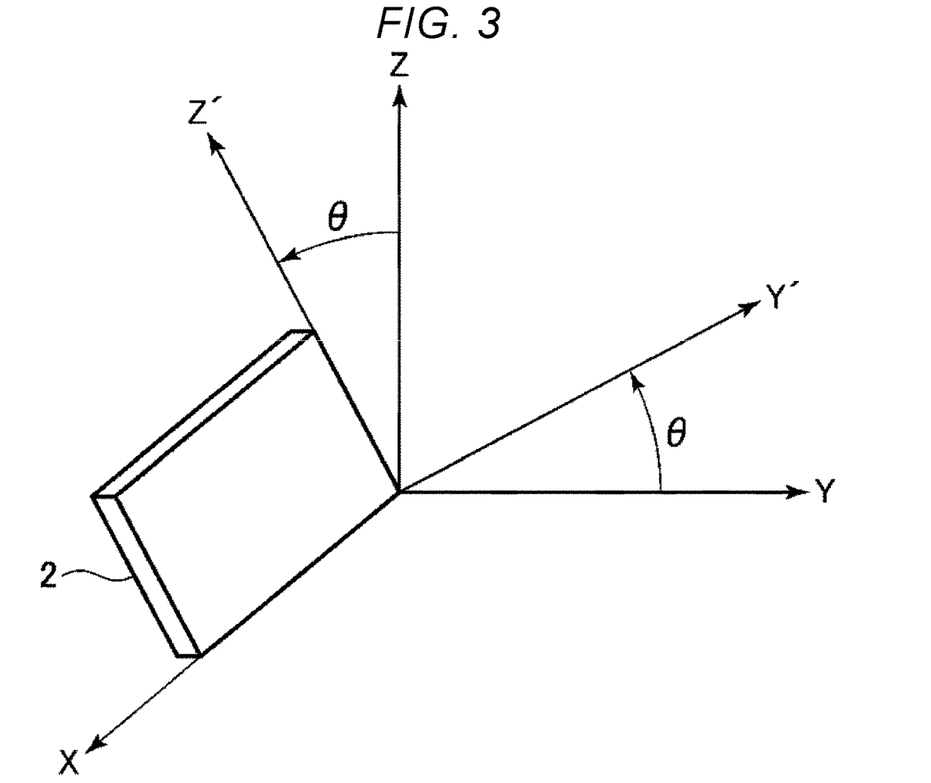
FIG. 3 is a diagram for explaining a cut angle of a quartz crystal substrate.
Figure 4:
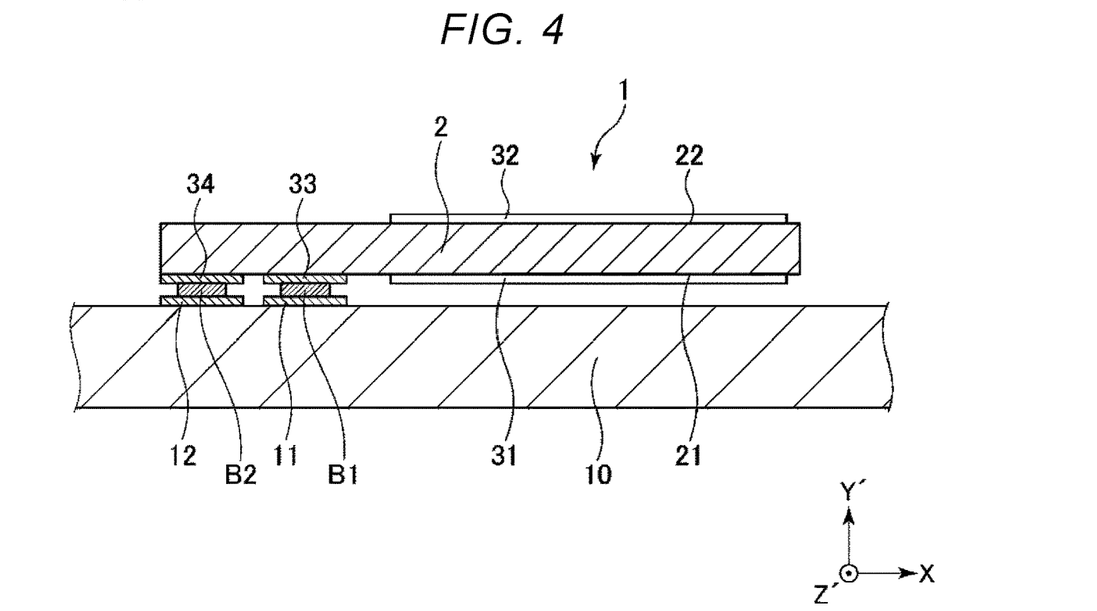
FIG. 4 is a cross-sectional view showing a state in which a resonator is attached to an object.
Figure 5:
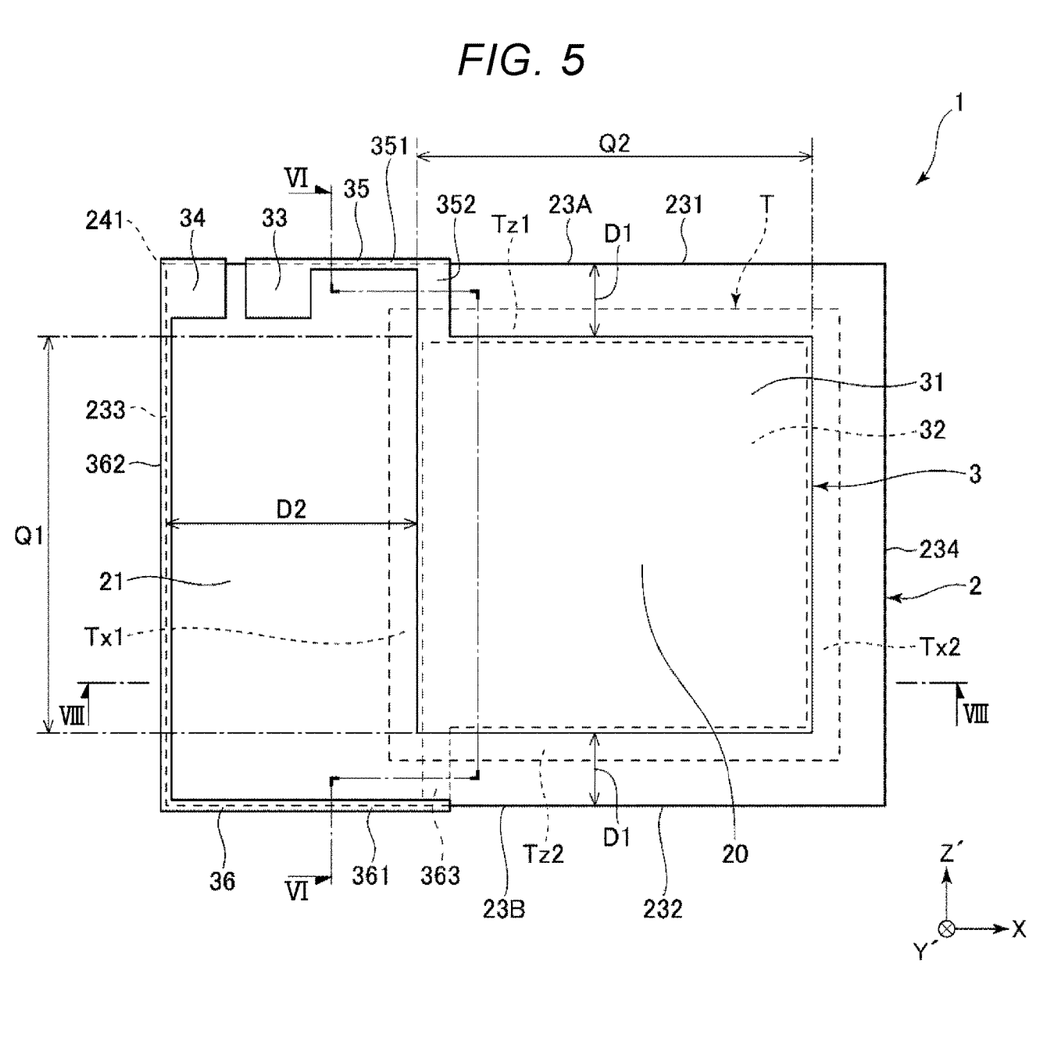
FIG. 5 is a plan view showing the resonator element when viewed from a positive side of a Y' axis.
Figure 6:
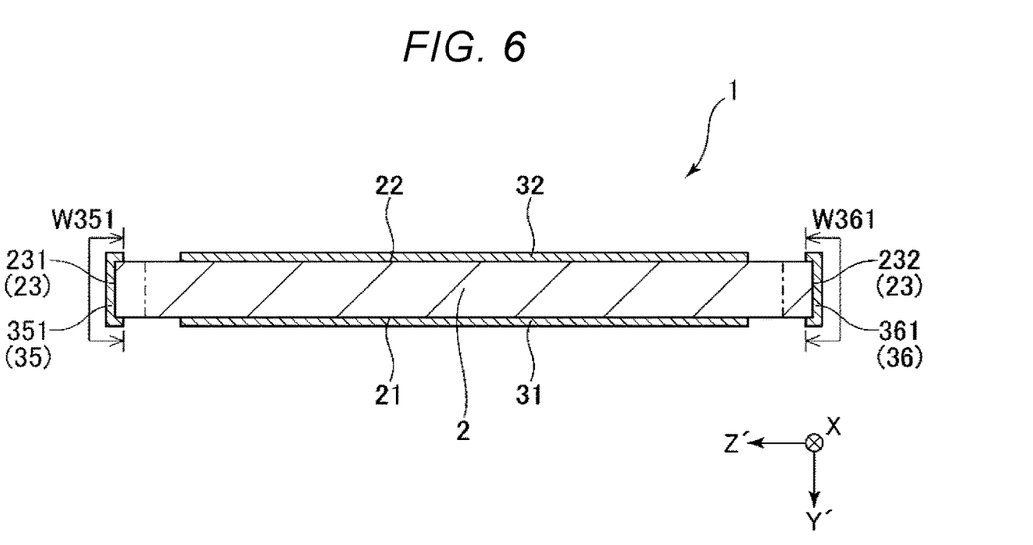
FIG. 6 is a cross-sectional view taken along line VI-VI in FIG. 5.
Figure 7:
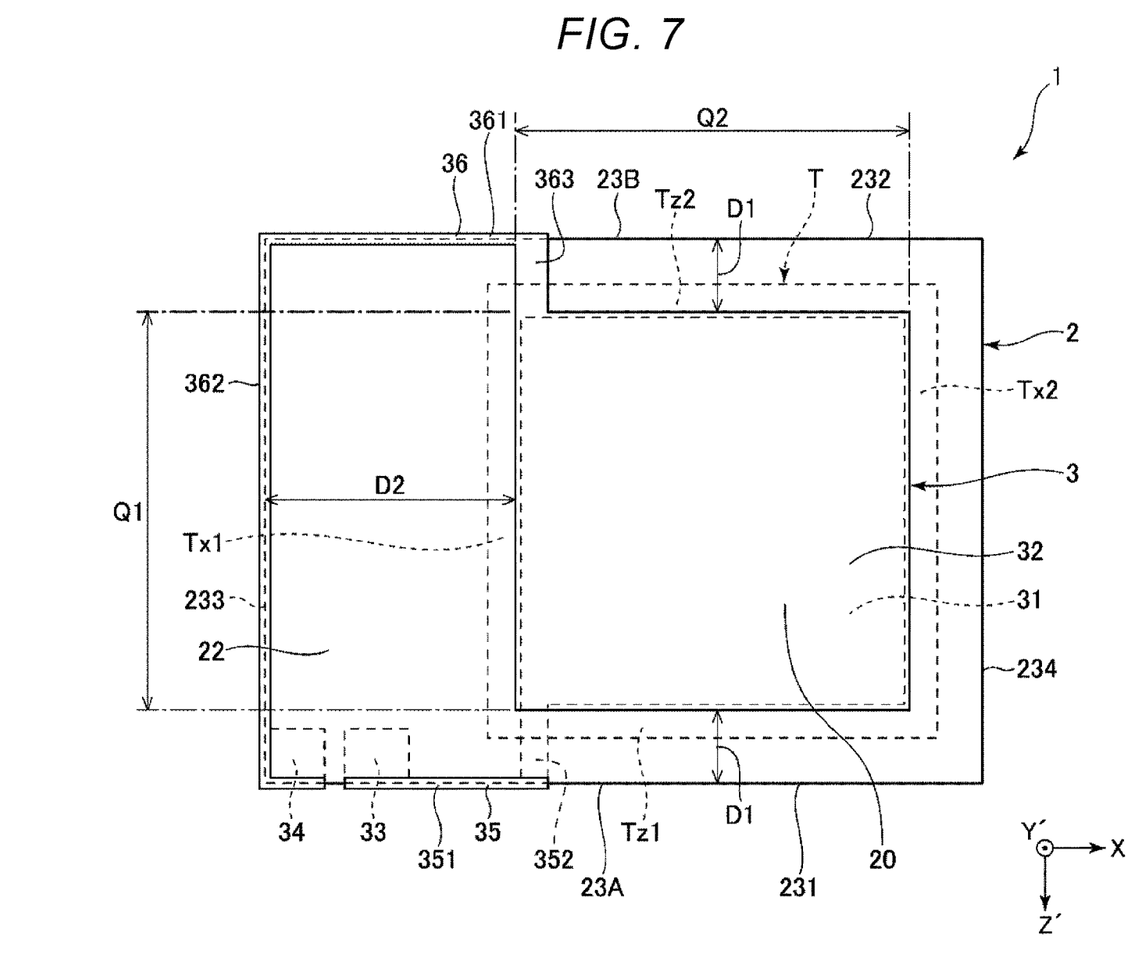
FIG. 7 is a plan view showing the resonator element when viewed from a negative side of the Y' axis.
Figure 8:
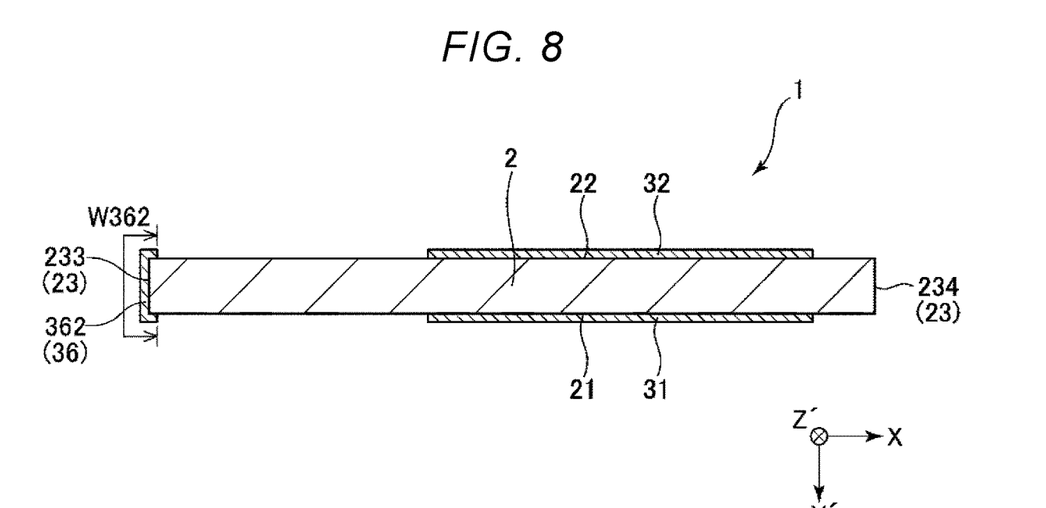
FIG. 8 is a cross-sectional view taken along line VIII-VIII in FIG. 5.

FIGS. 1 and 2 are perspective views showing a resonator element according to a first embodiment. FIG. 3 is a diagram for explaining a cut angle of a quartz crystal substrate. FIG. 4 is a cross-sectional view showing a state in which a resonator is attached to an object. FIG. 5 is a plan view showing the resonator element when viewed from a positive side of a Y' axis. FIG. 6 is a cross-sectional view taken along line VI-VI in FIG. 5. FIG. 7 is a plan view showing the resonator element when viewed from a negative side of the Y' axis. FIG. 8 is a cross-sectional view taken along line VIII-VIII in FIG. 5.

A resonator element 1 shown in FIGS. 1 and 2 includes a quartz crystal substrate 2 and an electrode 3 disposed at a surface of the quartz crystal substrate 2. The quartz crystal substrate 2 has a thickness shear vibration mode, and is formed of an AT cut quartz crystal substrate in the present embodiment. The AT cut quartz crystal substrate has a third-order frequency temperature characteristics, and the resonator element 1 having excellent temperature characteristics is obtained.

Briefly describing the AT cut quartz crystal substrate 2, the quartz crystal substrate 2 has crystal axes X, Y, and Z orthogonal to each other. The X axis, the Y axis, and the Z axis are called an electrical axis, a mechanical axis, and an optical axis, respectively. As shown in FIG. 3, the quartz crystal substrate 2 is a "rotated Y-cut quartz crystal substrate" cut along a plane obtained by rotating the X-Z plane around the X axis at a predetermined angle θ, and a substrate cut along a plane rotated at an angle θ=35°15' is called an "AT cut quartz crystal substrate".

Hereinafter, for convenience of explanation, the Y axis and the Z axis rotated around the X axis at the angle θ are referred to as the Y' axis and the Z' axis. That is, the quartz crystal substrate 2 has a thickness along the Y' axis and has a spread along the X-Z' plane. However, the quartz crystal substrate 2 is not limited to an AT cut quartz crystal substrate as long as it can excite thickness shear vibration and has a spread along a plane including the X axis. Hereinafter, a tip end side of an arrow of each axis is referred to as a "positive side", and an opposite side thereof is referred to as a "negative side".

As shown in FIGS. 1 and 2, the quartz crystal substrate 2 has a lower surface 21 and an upper surface 22 that are in a front and back relationship with each other and a side surface 23 that couples the lower surface 21 and the upper surface 22. Further, the external shape of the quartz crystal substrate 2 is a rectangle in plan view along the Y' axis, and in particular, a rectangle having a long side along the X axis and a short side along the Z' axis. Therefore, the side surface 23 includes a first side surface 231 and a second side surface 232 facing each other along the X axis, a third side surface 233 which is disposed along the Z' axis and couples the ends of the first and second side surfaces 231 and 232 at the X axis negative side, and a fourth side surface 234 which is disposed along the Z' axis and couples the ends of the first and second side surfaces 231 and 232 at the X axis positive side.

However, the shape of the quartz crystal substrate 2 is not particularly limited. For example, it may be a rectangular having a short side along the X axis and a long side along the Z' axis, a square, or a shape other than a rectangle.

The electrode 3 includes a first excitation electrode 31 disposed at the lower surface 21 of the quartz crystal substrate 2 and a second excitation electrode 32 disposed at the upper surface 22 and faces the first excitation electrode 31 via the quartz crystal substrate 2. Further, the electrode 3 includes a first coupling electrode 33 and a second coupling electrode 34 disposed at the lower surface 21 of the quartz crystal substrate 2, a first extraction electrode 35 that electrically couples the first coupling electrode 33 and the first excitation electrode 31, and a second extraction electrode 36 that electrically couples the second coupling electrode 34 and the second excitation electrode 32.

In such a resonator element 1, when a driving voltage is applied between the first and second excitation electrodes 31 and 32 via the first and second coupling electrodes 33 and 34, a vibration region 20 interposed between the first excitation electrode 31 and the second excitation electrode 32 excites in a thickness shear vibration mode.

As shown in FIG. 4, the resonator element 1 is attached to an object 10 via a first conductive bonding member B1 and a second conductive bonding member B2 with the lower surface 21 facing the object 10 side. That is, the first and second coupling electrodes 33 and 34 function as an attacher of the resonator element 1 to the object 10. Further, a first wiring 11 and a second wiring 12 are disposed in the object 10, the first coupling electrode 33 is electrically coupled to the first wiring 11 by the first conductive bonding member B1, and the second coupling electrode 34 is electrically coupled to the second wiring 12 by the second conductive bonding member B2.

The configuration of the resonator element 1 is not limited to the above-described configuration. For example, the resonator element 1 may have a mesa shape in which the vibration region 20 is protruding from the periphery thereof, or conversely, may have an inverted mesa shape in which the vibration region 20 is recessed from the periphery thereof. When the resonator element 1 has a mesa shape, the vibration region 20 may be configured to protrude to both sides of the lower surface 21 and the upper surface 22, or may be configured to protrude to one side. Similarly, when the resonator element 1 has an inverted mesa shape, the vibration region 20 may be recessed from both the lower surface 21 side and the upper surface 22 side, or may be recessed from one side. Further, "beveling" for grinding the vicinity of the quartz crystal substrate 2 to chamfer the corner or "convex processing" for forming the lower surface 21 and the upper surface 22 as curved convex surfaces may be applied.

Here, as shown in FIG. 5, when a region obtained by extending the first excitation electrode 31 along the X axis in plan view along the Y' axis is defined as a first region Q1, the first and second coupling electrodes 33 and 34 are both located outside the first region Q1. In the present embodiment, the first and second coupling electrodes 33 and 34 are both located at the Z' axis positive side of the first region Q1.

Since thickness shear vibration along the X axis is generated in the vibration region 20, when the first and second coupling electrodes 33 and 34 are disposed in a region T around the vicinity of the vibration region 20, and in particular, in a vibration direction, that is the regions Tx1 and Tx2 in the vicinity of both sides of the X axis, for example, a crystal impedance (CI) of the resonator element 1 may increase, which may affect the vibration characteristics. Further, when an attachment position to the object 10 is in the regions Tx1 and Tx2, thermal stress caused by the difference in thermal expansion coefficient between the object 10 and the quartz crystal substrate 2 is easily transmitted to the vibration region 20, and the vibration characteristics, particularly frequency/temperature characteristics, may be deteriorated. Therefore, in the resonator element 1, the first and second coupling electrodes 33 and 34 are disposed outside the first region Q1, so that the first and second coupling electrodes 33 and 34 are not disposed in the regions Tx1 and Tx2. As a result, the reduction in the vibration characteristics as described above is effectively suppressed, and the resonator element 1 having excellent vibration characteristics is obtained.

When a region obtained by extending the first excitation electrode 31 along the Z' axis is defined as a second region Q2, the first and second coupling electrodes 33 and 34 are both located outside the second region Q2. In the present embodiment, the first and second coupling electrodes 33 and 34 are both located at the X axis negative side of the second region. As a result, the first and second coupling electrodes 33 and 34 can be more reliably disposed outside the region T, and the reduction in the vibration characteristics as described above is more effectively suppressed, and thereby the resonator element 1 having more excellent vibration characteristics is obtained.

The first and second coupling electrodes 33 and 34 are disposed to be biased toward the vicinity of a corner 241 where the first side surface 231 is coupled to the third side surface 233. Therefore, the attachment position of the resonator element 1 to the object 10 can be kept away from the vibration region 20 as much as possible. As a result, the above-described thermal stress is more difficult to be transmitted to the vibration region 20, and the resonator element 1 having more excellent vibration characteristics is obtained.

The first and second coupling electrodes 33 and 34 are disposed along the first side surface 231. That is, the first and second coupling electrodes 33 and 34 are arranged side by side along the X axis. By arranging the first and second coupling electrodes 33 and 34 in this way, the separation distance D1 between the first side surface 231 and the first region Q1 can be reduced while disposing the first and second coupling electrodes 33 and 34 outside the first region Q1. Therefore, the size of the resonator element 1 can be reduced. In particular, in the present embodiment, the first coupling electrode 33 is located at the X axis positive side with respect to the second coupling electrode 34, that is, the side closer to the vibration region 20. This arrangement makes the routing of the first and second extraction electrodes 35 and 36 easier as will be described later.

As shown in FIG. 5, the first extraction electrode 35 electrically couples the first excitation electrode 31 and the first coupling electrode 33. Such a first extraction electrode 35 has a first electrode portion 351 disposed along the X axis and a second electrode portion 352 disposed along the Z' axis.

The first electrode portion 351 is located outside the first region Q1. In the present embodiment, the first electrode portion 351 is located at the Z' axis positive side of the first region Q1. As described above, the first electrode portion 351 is disposed outside the first region Q1, so that the first electrode portion 351 is not disposed in the regions Tx1 and Tx2. As a result, the reduction in the vibration characteristics as described above is effectively suppressed, and the resonator element 1 having excellent vibration characteristics is obtained.

Here, the side surface 23 has a first portion 23A located outside the first region Q1 and located at the Z' axis positive side of the first region Q1. The first portion 23A is included in the first side surface 231. Then, the first electrode portion 351 is disposed along the first portion 23A, that is the first side surface 231 and is continuously coupled to the first coupling electrode 33 at the X axis negative side end. That is, no other portion is interposed between the first electrode portion 351 and the first coupling electrode 33. Here, since the first coupling electrode 33 is located at the X axis positive side from the second coupling electrode 34, the coupling between the first electrode portion 351 and the first coupling electrode 33 is not disturbed by the second coupling electrode 34, and it becomes easier to couple the first electrode portion 351 and the first coupling electrode 33 continuously. That is, the routing of the first extraction electrode 35 becomes easier.

As shown in FIG. 6, the first electrode portion 351 is disposed over the first side surface 231, the lower surface 21, and the upper surface 22. With such a configuration, a width W351 of the first electrode portion 351 can be sufficiently increased. Therefore, the wiring resistance of the first extraction electrode 35 is decreased. Further, the protrusion of the first electrode portion 351 to the lower surface 21 and the upper surface 22 can be suppressed. Therefore, the separation distance D1 between the first side surface 231 and the first region Q1 can be reduced, and the size of the resonator element 1 can be reduced.

By disposing the first electrode portion 351 over the first side surface 231, the lower surface 21, and the upper surface 22, patterning of the electrode film for forming the electrode 3 becomes easier, for example, compared to a case where the first electrode portion 351 is disposed only in the first side surface 231 without protruding to the lower surface 21 and the upper surface 22, so that the disconnection of the first electrode portion 351 during manufacturing can be effectively suppressed.

In the present embodiment, the first electrode portion 351 is disposed over the first side surface 231, the lower surface 21, and the upper surface 22 in the entire region of the first electrode portion 351 along the X axis, but is not limited thereto. The first electrode portion 351 only needs to be disposed over the first side surface 231, the lower surface 21, and the upper surface 22 in at least a part along the X axis.

As shown in FIG. 5, the second electrode portion 352 is disposed at the lower surface 21 and couples the X axis positive side end of the first electrode portion 351 and the first excitation electrode 31. Such a second electrode portion 352 is disposed so as to avoid the regions Tx1 and Tx2. Specifically, the entire region of the second electrode portion 352 is located in the second region Q2, and the second electrode portion 352 is disposed so as to pass through a region Tz1 located at the Z' axis positive side with respect to the vibration region 20 in the region T. According to such an arrangement, the second electrode portion 352 is not disposed in the regions Tx1 and Tx2. For this reason, the reduction in the vibration characteristics as described above is effectively suppressed, and the resonator element 1 having excellent vibration characteristics is obtained.

The second electrode portion 352 is disposed along the Z' axis and has a linear shape. Accordingly, the first electrode portion 351 can be coupled to the first excitation electrode 31 with the shortest length, and the wiring resistance of the first extraction electrode 35 can be reduced. Further, the second electrode portion 352 is coupled to the X axis negative side end of the first excitation electrode 31, that is, the end closer to the first and second coupling electrodes 33 and 34. Accordingly, the first coupling electrode 33 can be coupled to the second electrode portion 352 with the shortest length, and the wiring resistance of the first extraction electrode 35 can be reduced. However, the configuration of the second electrode portion 352 is not particularly limited. For example, the second electrode portion 352 may be disposed so as to be inclined with respect to both the X axis and the Z' axis, and may be coupled to the X axis positive side end or the center of the first excitation electrode 31.

As shown in FIG. 7, the second extraction electrode 36 electrically couples the second excitation electrode 32 and the second coupling electrode 34. Such a second extraction electrode 36 has a third electrode portion 361 disposed along the X axis, and a fourth electrode portion 362 and a fifth electrode portion 363 disposed along the Z' axis.

The third electrode portion 361 is located outside the first region Q1. As described above, the third electrode portion 361 is disposed outside the first region Q1, so that the third electrode portion 361 is not disposed in the regions Tx1 and Tx2. As a result, the reduction in the vibration characteristics as described above is effectively suppressed, and the resonator element 1 having excellent vibration characteristics is obtained. In particular, in the present embodiment, the third electrode portion 361 is located at the Z' axis negative side of the first region Q1. That is, the third electrode portion 361 is located at the opposite side of the first electrode portion 351 while interposing the first region Q1 therebetween. Accordingly, the degree of freedom in the arrangement of the third electrode portion 361 increases.

Here, the side surface 23 has a second portion 23B located outside the first region Q1 and located at the Z' axis negative side of the first region Q1. The second portion 23B is included in the second side surface 232. The third electrode portion 361 is disposed along the second portion 23B, that is, the second side surface 232. As shown in FIG. 6, the third electrode portion 361 is disposed over the second side surface 232, the lower surface 21, and the upper surface 22. With such a configuration, a width W361 of the third electrode portion 361 can be made sufficiently wide. Therefore, the wiring resistance of the second extraction electrode 36 is reduced. Further, the protrusion of the third electrode portion 361 to the lower surface 21 and the upper surface 22 can be suppressed. Therefore, the separation distance D1 between the second side surface 232 and the first region Q1 can be reduced, and the size of the resonator element 1 can be reduced.

By disposing the third electrode portion 361 over the side surface 23, the lower surface 21, and the upper surface 22, patterning of the electrode film for forming the electrode 3 becomes easier, for example, compared to a case where the third electrode portion 361 is disposed only in the second side surface 232 without protruding to the lower surface 21 and the upper surface 22, so that the disconnection of the third electrode portion 361 during manufacturing can be effectively suppressed.

In the present embodiment, the third electrode portion 361 is disposed over the second side surface 232, the lower surface 21, and the upper surface 22 in the entire region of the third electrode portion 361 along the X axis, but is not limited thereto. The third electrode portion 361 only needs to be disposed over the second side surface 232, the lower surface 21, and the upper surface 22 in at least a part along the X axis.

As shown in FIG. 7, the fourth electrode portion 362 electrically couples the third electrode portion 361 and the second coupling electrode 34. The fourth electrode portion 362 is disposed along the third side surface 233 and is continuously coupled to the second coupling electrode 34 at the Z' axis positive side end. That is, no other portion is interposed between the fourth electrode portion 362 and the second coupling electrode 34. Here, as described above, since the second coupling electrode 34 is located at the X axis negative side from the first coupling electrode 33, that is the third side surface 233 side, the coupling between the fourth electrode portion 362 and the second coupling electrode 34 is not disturbed by the first coupling electrode 33, and it becomes easier to couple the fourth electrode portion 362 and the second coupling electrode 34 continuously. That is, the routing of the second extraction electrode 36 becomes easier.

Such a fourth electrode portion 362 needs to pass through the first region Q1 in order to couple the second coupling electrode 34 and the third electrode portion 361 disposed with the first region Q1 interposed therebetween. However, the fourth electrode portion 362 can be kept away from the vibration region 20 as much as possible by disposing the fourth electrode portion 362 along the third side surface 233. For this reason, the reduction in the vibration characteristics as described above is suppressed, and the resonator element 1 having excellent vibration characteristics is obtained.

As shown in FIG. 8, the fourth electrode portion 362 is disposed over the side surface 23, the lower surface 21, and the upper surface 22. With such a configuration, a width W362 of the fourth electrode portion 362 can be made sufficiently wide. Therefore, the wiring resistance of the second extraction electrode 36 is reduced. Further, the protrusion of the fourth electrode portion 362 to the lower surface 21 and the upper surface 22 can be suppressed. Therefore, the separation distance D2 between the third side surface 233 and the vibration region 20 can be reduced, and the size of the resonator element 1 can be reduced.

By disposing the fourth electrode portion 362 over the third side surface 233, the lower surface 21, and the upper surface 22, patterning of the electrode film for forming the electrode 3 becomes easier, for example, compared to a case where the fourth electrode portion 362 is disposed only in the third side surface 233 without protruding to the lower surface 21 and the upper surface 22, so that the disconnection of the fourth electrode portion 362 during manufacturing can be effectively suppressed.

In the present embodiment, the fourth electrode portion 362 is disposed over the third side surface 233, the lower surface 21, and the upper surface 22 in the entire region of the fourth electrode portion 362 along the Z' axis, but is not limited thereto. The fourth electrode portion 362 only needs to be disposed over the third side surface 233, the lower surface 21, and the upper surface 22 in at least a part along the Z' axis.

As shown in FIG. 7, the fifth electrode portion 363 is disposed at the upper surface 22 and couples the X axis positive side end of the third electrode portion 361 and the second excitation electrode 32. The fifth electrode portion 363 is disposed so as to avoid the regions Tx1 and Tx2. Specifically, the entire region of the fifth electrode portion 363 is located in the second region Q2, and the fifth electrode portion 363 is disposed so as to pass through a region Tz2 located at the Z' axis negative side with respect to the vibration region 20 in the region T. According to such an arrangement, the fifth electrode portion 363 is not disposed in the regions Tx1 and Tx2. For this reason, the reduction in the vibration characteristics as described above is effectively suppressed, and the resonator element 1 having excellent vibration characteristics is obtained.

The fifth electrode portion 363 is disposed along the Z' axis and has a linear shape. Accordingly, the third electrode portion 361 can be coupled to the second excitation electrode 32 with the shortest length, and the wiring resistance of the second extraction electrode 36 can be reduced. Further, the fifth electrode portion 363 is coupled to the X axis negative side end of the second excitation electrode 32, that is, the end closer to the first and second coupling electrodes 33 and 34. Accordingly, the fourth electrode portion 362 can be coupled to the fifth electrode portion 363 with the shortest length, and the wiring resistance of the second extraction electrode 36 can be reduced. However, the configuration of the fifth electrode portion 363 is not particularly limited. For example, the fifth electrode portion 363 may be disposed so as to be inclined with respect to both the X axis and the Z' axis, and may be coupled to the X axis positive side end or the center of the second excitation electrode 32.

The resonator element 1 has been described above. Such a resonator element 1 includes, as described above, the quartz crystal substrate 2 including the lower surface 21 as a first surface and the upper surface 22 as a second surface that are in a front and back relationship with each other and are disposed along the X axis which is an electrical axis, and the side surface 23 that couples the lower surface 21 and the upper surface 22, the first excitation electrode 31 disposed at one of the lower surface 21 and the upper surface 22, in the present embodiment, the lower surface 21, the second excitation electrode 32 disposed at the other side of the lower surface 21 and the upper surface 22, in the present embodiment, the upper surface 22, the first coupling electrode 33 and the second coupling electrode 34 disposed at the lower surface 21, the first extraction electrode 35 that couples the first excitation electrode 31 and the first coupling electrode 33, and the second extraction electrode 36 that couples the second excitation electrode 32 and the second coupling electrode 34. In plan view of the quartz crystal substrate 2, when a region obtained by extending the first excitation electrode 31 along the X axis is a first region Q1 as an extension region, the side surface 23 has the first portion 23A located at one side of the first region Q1 and the second portion 23B located at the other side, and the first coupling electrode 33 and the second coupling electrode 34 are disposed along the first portion 23A. Further, the first extraction electrode 35 has the first electrode portion 351 which extends along the first portion 23A and is continuous with the first coupling electrode 33, and the first electrode portion 351 is disposed over the side surface 23, the lower surface 21, and the upper surface 22.

With such a configuration, the first coupling electrode 33, the second coupling electrode 34, and the first extraction electrode 35 can be disposed outside the region T around the vicinity of the vibration region 20, in particular, in a vibration direction, that is the regions Tx1 and Tx2 in the vicinity of both sides of the X axis. For this reason, the reduction in the vibration characteristics is effectively suppressed, and the resonator element 1 having excellent vibration characteristics is obtained. Further, the protrusion of the first electrode portion 351 to the lower surface 21 and the upper surface 22 can be suppressed while sufficiently making the width W351 of the first electrode portion 351 to be wide. Therefore, the wiring resistance of the first extraction electrode 35 is decreased. Further, the separation distance D1 between the first side surface 231 and the first region Q1 can be reduced, and the size of the resonator element 1 can be reduced.

As described above, the first coupling electrode 33 and the second coupling electrode 34 are disposed at the first portion 23A side with respect to the first region Q1. Accordingly, the first and second coupling electrodes 33 and 34 can be more reliably disposed outside the regions Tx1 and Tx2. However, the arrangement is not limited to this, and at least one of the first and second coupling electrodes 33 and 34 may be located in the first region Q1.

As described above, the first coupling electrode 33 is located closer to the first excitation electrode 31 than is the second coupling electrode 34. This arrangement makes the routing of the first and second extraction electrodes 35 and 36 easier. However, the arrangement of the first and second coupling electrodes 33 and 34 is not particularly limited. Contrary to the above, the first coupling electrode 33 may be located farther to the first excitation electrode 31 than is the second coupling electrode 34.

As described above, the first extraction electrode 35 has the second electrode portion 352 that couples the first electrode portion 351 and the first excitation electrode 31, and the second electrode portion 352 is disposed along an axis orthogonal to the X axis. Accordingly, the second electrode portion 352 can be disposed outside the regions Tx1 and Tx2, and the entire region of the first extraction electrode 35 is located outside the regions Tx1 and Tx2. For this reason, the reduction in the vibration characteristics is more effectively suppressed, and the resonator element 1 having more excellent vibration characteristics is obtained.

As described above, the second electrode portion 352 is coupled to an end of the first excitation electrode 31 along the X axis. Accordingly, the wiring length of the first extraction electrode 35 can be shortened, and the resistance of the first extraction electrode 35 can be lowered.

As described above, the side surface 23 includes the first side surface 231, the second side surface 232, the third side surface 233, and the fourth side surface 234, and have a rectangular shape in which the first side surface 231 and the second side surface 232 are disposed along the X axis and the third side surface 233 and the fourth side surface 234 are disposed so as to intersect the X axis. The first portion 23A is included in the first side surface 231, and the second portion 23B is included in the second side surface 232. Then, the second extraction electrode 36 includes the third electrode portion 361 extending along the second side surface 232 and the fourth electrode portion 362 extending along the third side surface 233. With such a configuration, the third and fourth electrode portions 361 and 362 can be disposed outside the regions Tx1 and Tx2. For this reason, the reduction in the vibration characteristics is effectively suppressed, and the resonator element 1 having excellent vibration characteristics is obtained.

As described above, the third electrode portion 361 is disposed over the side surface 23, the lower surface 21, and the upper surface 22. With such a configuration, the protrusion of the third electrode portion 361 to the lower surface 21 and the upper surface 22 can be suppressed while sufficiently making the width W361 of the third electrode portion 361 to be wide. Therefore, the wiring resistance of the second extraction electrode 36 is reduced. Further, the separation distance D1 between the second side surface 232 and the first region Q1 can be reduced, and the size of the resonator element 1 can be reduced.

As described above, the fourth electrode portion 362 is disposed over the side surface 23, the lower surface 21, and the upper surface 22. With such a configuration, the protrusion of the fourth electrode portion 362 to the lower surface 21 and the upper surface 22 can be suppressed while sufficiently making the width W362 of the fourth electrode portion 362 to be wide. Therefore, the wiring resistance of the second extraction electrode 36 is reduced. Further, the separation distance D2 between the third side surface 233 and the vibration region 20 can be reduced, and the size of the resonator element 1 can be reduced.

As described above, the external shape of the quartz crystal substrate 2 is a shape in which the longitudinal direction is along the X axis. In particular, the external shape of the quartz crystal substrate 2 of the present embodiment is a rectangle including a long side along the X axis and a short side along the Z' axis intersecting the X axis. By applying a shape in which the longitudinal direction is along the X axis, the vibration region 20 and the first and second coupling electrodes 33 and 34 can be disposed further apart from each other along the X axis. For this reason, the reduction in the vibration characteristics is effectively suppressed, and the resonator element 1 having excellent vibration characteristics is obtained.

Second Embodiment

Figure 9:
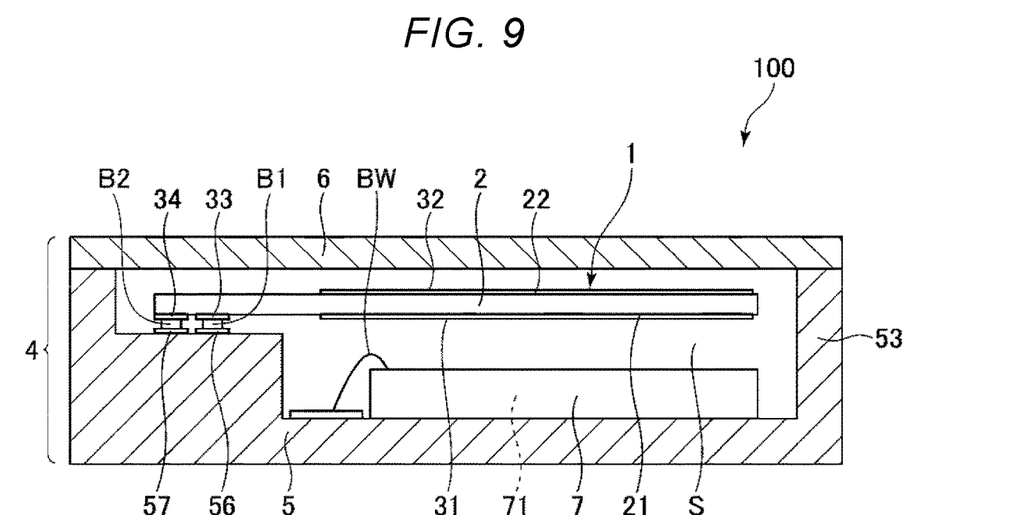
FIG. 9 is a cross-sectional view showing a resonator device according to a second embodiment.

FIG. 9 is a cross-sectional view showing a resonator device according to a second embodiment.

As shown in FIG. 9, a resonator device 100 according to the present embodiment includes the resonator element 1, a circuit element 7, and a package 4 that stores the resonator element 1 and the circuit element 7. Further, the package 4 includes a box-shaped base 5 with a recess 53 for storing the resonator element 1 and a plate-shaped lid 6 bonded to the base 5 by closing the opening of the recess 53. A storing space S for storing the resonator element 1 is formed by closing the opening of the recess 53 with the lid 6. The storing space S is airtight and is in a reduced pressure state.

The constituent material of the base 5 is not particularly limited, and for example, various ceramics such as aluminum oxide can be used. The constituent material of the lid 6 is not particularly limited, and may be a member having a linear expansion coefficient similar to that of the constituent material of the base 5. For example, when the constituent material of the base 5 is a ceramic as described above, an alloy such as Kovar is preferable.

The base 5 has a first wiring 55 and a second wiring 56 disposed in the recess 53. The resonator element 1 is stored in the storing space S in a posture in which the lower surface 21 faces the bottom surface side of the recess 53. Then, the resonator element 1 is fixed to the bottom surface of the recess 53 by the first conductive bonding member B1 and the second conductive bonding member B2. Further, the first conductive bonding member B1 electrically couples the first wiring 55 and the first coupling electrode 33 of the resonator element 1, and the second conductive bonding member B2 electrically couples the second wiring 56 and the second coupling electrode 34 of the resonator element 1.

The first and second conductive bonding members B1 and B2 are not particularly limited as long as they have both conductivity and bondability, and examples thereof include various metal bumps such as gold bumps, silver bumps, copper bumps, and solder bumps, conductive adhesive in which conductive fillers such as silver filler are dispersed in polyimide, epoxy, silicone, and acrylic adhesives.

The circuit element 7 is disposed at the bottom surface of the recess 53 and is electrically coupled to the first wiring 55 and the second wiring 56 via a bonding wire BW. Such a circuit element 7 includes an oscillation circuit 71 that is electrically coupled to the resonator element 1.

As described above, the resonator device 100 includes the resonator element 1, the base 5, the first conductive bonding member B1 that bonds the first coupling electrode 33 and the base 5, and the second conductive bonding member B2 that bonds the second coupling electrode 34 and the base 5. With such a configuration, the resonator device 100 that can enjoy the effect of the resonator element 1 described above and has excellent reliability is obtained.

Third Embodiment

Figure 10:
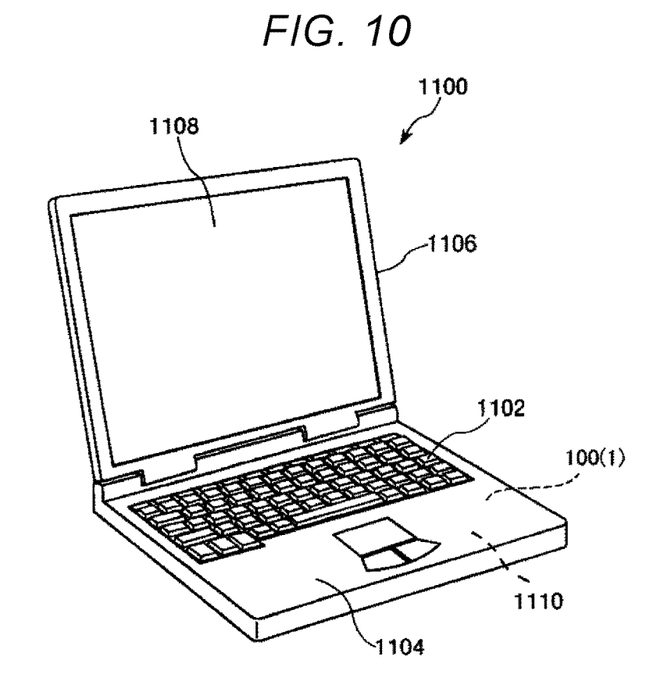
FIG. 10 is a perspective view showing an electronic apparatus according to a third embodiment.

FIG. 10 is a perspective view showing an electronic apparatus according to a third embodiment.

A laptop personal computer 1100 as an electronic apparatus shown in FIG. 10 includes a main body 1104 provided with a keyboard 1102 and a display unit 1106 provided with a display 1108, and the display unit 1106 is supported so as to be rotatable with respect to the main body 1104 via a hinge structure. Such a personal computer 1100 incorporates, for example, the resonator device 100 used as an oscillator. Further, the personal computer 1100 includes an arithmetic processing circuit 1110 that performs arithmetic processing related to control of the keyboard 1102, the display 1108, and the like. The arithmetic processing circuit 1110 operates based on, for example, an oscillation signal output from the oscillation circuit 71 of the resonator device 100.

As described above, the personal computer 1100 as the electronic apparatus includes the resonator device 100. Therefore, the effect of the resonator element 1 described above can be enjoyed and high reliability can be exhibited.

Fourth Embodiment

Figure 11:
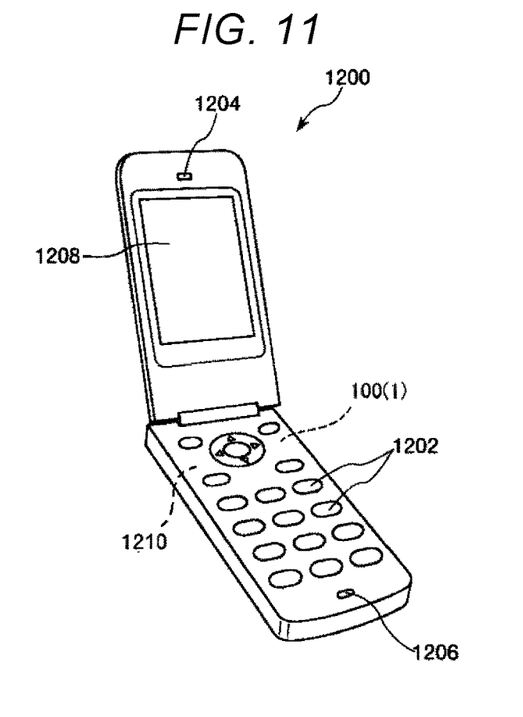
FIG. 11 is a perspective view showing an electronic apparatus according to a fourth embodiment.

FIG. 11 is a perspective view showing an electronic apparatus according to a fourth embodiment.

A mobile phone 1200 as an electronic apparatus shown in FIG. 11 includes an antenna, a plurality of operation buttons 1202, an earpiece 1204, and a mouthpiece 1206, and a display 1208 is disposed between the operation buttons 1202 and the earpiece 1204. Such a mobile phone 1200 incorporates, for example, the resonator device 100 used as an oscillator. Further, the mobile phone 1200 includes an arithmetic processing circuit 1210 that performs arithmetic processing related to control of the operation buttons 1202 and the like. The arithmetic processing circuit 1210 operates based on, for example, an oscillation signal output from the oscillation circuit 71 included in the resonator device 100.

As described above, the mobile phone 1200 as an electronic apparatus includes the resonator device 100. Therefore, the effect of the resonator element 1 described above can be enjoyed and high reliability can be exhibited.

Fifth Embodiment

Figure 12:
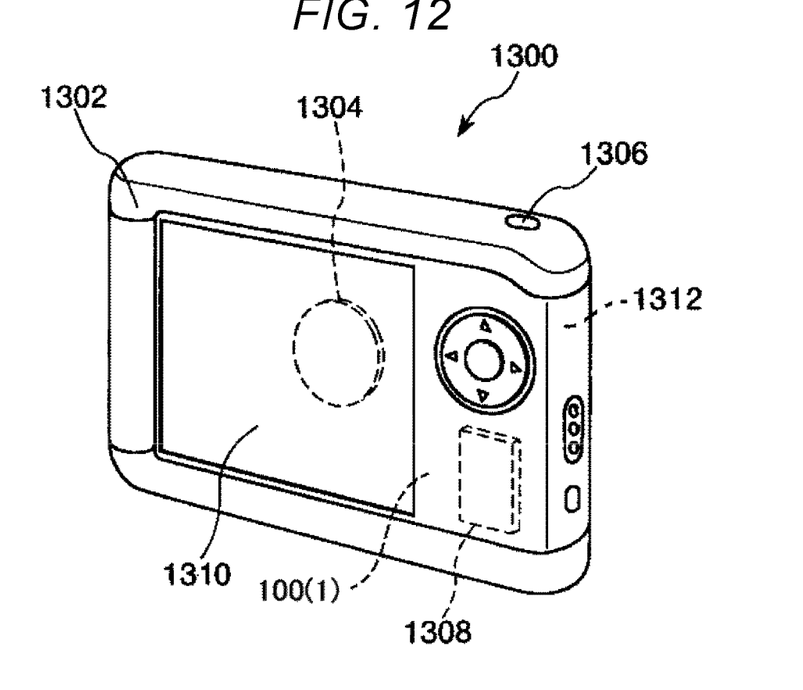
FIG. 12 is a perspective view showing an electronic apparatus according to a fifth embodiment.

FIG. 12 is a perspective view showing an electronic apparatus according to a fifth embodiment.

A digital still camera 1300 as an electronic apparatus shown in FIG. 12 is provided with a display 1310 at the back surface of a body 1302 and is configured to perform display based on an imaging signal from the CCD, and the display 1310 functions as a viewfinder that displays an object as an electronic image. Further, a light receiving unit 1304 including an optical lens and a CCD is provided at the front side (the back side in FIG. 12) of the body 1302. When a photographer checks the subject image displayed at the display 1310 and presses a shutter button 1306, the CCD imaging signal at that time is transferred and stored in a memory 1308. Such a digital still camera 1300 incorporates, for example, the resonator device 100 used as an oscillator. Further, the digital still camera 1300 includes an arithmetic processing circuit 1312 that performs arithmetic processing related to control of the display 1310, the light receiving unit 1304, and the like. The arithmetic processing circuit 1312 operates based on, for example, an oscillation signal output from the oscillation circuit 71 of the resonator device 100.

As described above, the digital still camera 1300 as an electronic apparatus includes the resonator device 100. Therefore, the effect of the resonator element 1 described above can be enjoyed and high reliability can be exhibited.

The electronic apparatus according to the present disclosure can be applied to, for example, a smartphone, a tablet terminal, a timepiece (including a smart watch), an ink jet ejecting apparatus (for example, ink jet printer), a television, a wearable terminal such as a head mount display (HMD), a video camera, a video tape recorder, a car navigation system, a pager, an electronic notebook (including a type having a communication function), electronic dictionary, an electronic calculator, an electronic game machine, a word processor, a workstation, a video phone, a security television monitor, electronic binoculars, a POS terminal, a medical apparatus (for example, an electronic thermometer, a blood pressure monitor, a blood glucose meter, an electrocardiogram measuring device, an ultrasonic diagnostic device, and an electronic endoscope), a fish finder, various measuring instruments, an apparatus for a vehicle terminal and a base station, instruments (for example, instruments of vehicles, aircrafts, and ships), a flight simulator, a network server, and the like in addition to personal computers, mobile phones, and digital still cameras.

Sixth Embodiment

Figure 13:
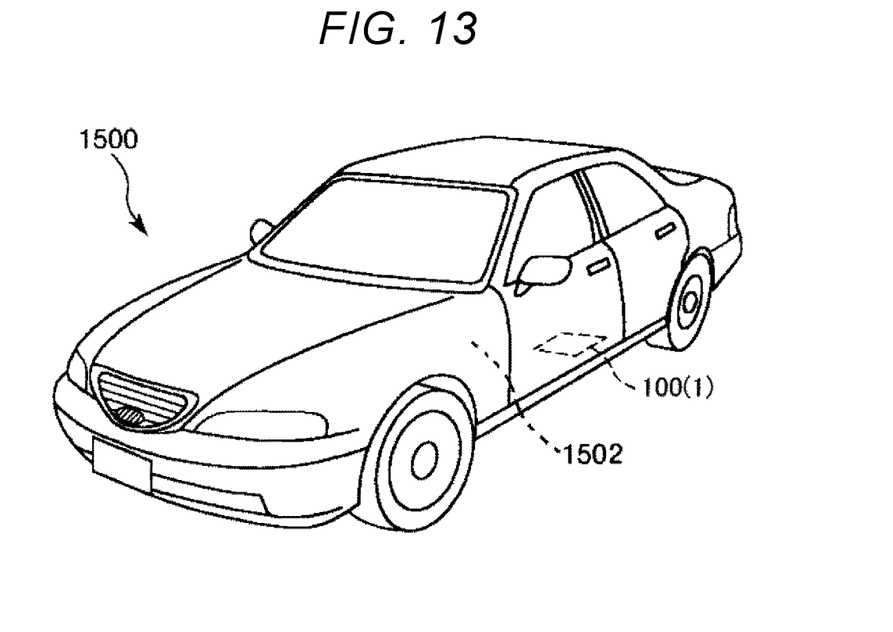
FIG. 13 is a perspective view of a vehicle according to a sixth embodiment.

FIG. 13 is a perspective view of a vehicle according to a sixth embodiment.

An automobile 1500 as a vehicle shown in FIG. 13 incorporates, for example, the resonator device 100 used as an oscillator and an arithmetic processing circuit 1502 that operates based on an oscillation signal output from the oscillation circuit 71 of the resonator device 100. Such resonator device 100 and arithmetic processing circuit 1502 can be widely applied to electronic control units (ECUs) such as a keyless entry, an immobilizer, a car navigation system, a car air conditioner, an antilock brake system (ABS), an airbag, a tire pressure monitoring system (TPMS), engine control, a battery monitor of a hybrid automobile or an electric car, and a vehicle body attitude control system.

As described above, the automobile 1500 as a vehicle includes the resonator device 100. Therefore, the effect of the resonator element 1 described above can be enjoyed and high reliability can be exhibited.

The vehicle is not limited to the automobile 1500, for example, and can also be applied to an airplane, a ship, an automated guided vehicle (AGV), a biped walking robot, unmanned airplanes such as a drone, and the like.

As described above, the resonator element, the resonator device, the electronic apparatus, and the vehicle according to the present disclosure have been described based on the illustrated embodiments. However, the present disclosure is not limited to this, and the configuration of each part can be replaced with any configuration having a similar function. In addition, any other component may be added to the present disclosure.

What is claimed is:

1. A resonator element comprising:
a quartz crystal substrate including
a first surface along an X axis which is an electrical axis,
a second surface along the X axis in a front and back relationship with the first surface, and
a side surface that couples the first surface and the second surface;
a first excitation electrode disposed at the first surface;
a second excitation electrode disposed at the second surface;
a first coupling electrode disposed at the first surface;
a second coupling electrode disposed at the first surface;
a first extraction electrode that couples the first excitation electrode and the first coupling electrode; and
a second extraction electrode that couples the second excitation electrode and the second coupling electrode, wherein
when a region obtained by extending the first excitation electrode along the X axis is a virtual extension region in plan view of the quartz crystal substrate,
the side surface includes a first side surface located at one side of the extension region,
the first coupling electrode and the second coupling electrode are disposed along the first side surface,
the first extraction electrode has a first electrode portion which is disposed along the first side surface and is continuous with the first coupling electrode, and
the first electrode portion is disposed over the first side surface, the first surface, and the second surface.

2. The resonator element according to claim 1, wherein the first coupling electrode and the second coupling electrode are disposed at the first side surface side with respect to the extension region.

3. The resonator element according to claim 1, wherein the first coupling electrode is located closer to the first excitation electrode than is the second coupling electrode.

4. The resonator element according to claim 1, wherein the first extraction electrode has a second electrode portion that couples the first electrode portion and the first excitation electrode, and
the second electrode portion is disposed along an axis orthogonal to the X axis.

5. The resonator element according to claim 4, wherein the second electrode portion is coupled to an end of the first excitation electrode along the X axis.

6. The resonator element according to claim 1, wherein the side surface further includes
a second side surface located at an opposite side of the first side surface with respect to the extension region,
a third side surface intersecting the X axis, and
a fourth side surface intersecting the X axis, and
the second extraction electrode includes a third electrode portion disposed along the second side surface and a fourth electrode portion disposed along the third side surface.

7. The resonator element according to claim 6, wherein the third electrode portion is disposed over the second side surface, the first surface, and the second surface.

8. The resonator element according to claim 6, wherein the fourth electrode portion is disposed over the third side surface, the first surface, and the second surface.

9. A resonator device comprising:
the resonator element according to claim 1;
a base;
a first conductive bonding member that bonds the first coupling electrode and the base; and
a second conductive bonding member that bonds the second coupling electrode and the base.

10. An electronic apparatus comprising the resonator device according to claim 9.

11. A vehicle comprising the resonator device according to claim 9.

* * * * *